(12) United States Patent
Chen et al.

(10) Patent No.: US 8,717,137 B2
(45) Date of Patent: May 6, 2014

(54) ON-CHIP INDUCTOR USING REDISTRIBUTION LAYER AND DUAL-LAYER PASSIVATION

(75) Inventors: Henry Kuo-Shun Chen, Irvine, CA (US); Guang-Jye Shiau, Irvine, CA (US); Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1655 days.

(21) Appl. No.: 11/443,171

(22) Filed: May 31, 2006

(65) Prior Publication Data

US 2007/0279176 A1    Dec. 6, 2007

(51) Int. Cl.
*H01F 5/00* (2006.01)

(52) U.S. Cl.
USPC ......................................................... 336/200

(58) Field of Classification Search
USPC ..................... 336/65, 83, 200, 206–208, 232; 257/531
See application file for complete search history.

(56) References Cited

U.S. PATENT DOCUMENTS

| | | | | |
|---|---|---|---|---|
| 6,355,535 B2* | 3/2002 | Liou | | 438/381 |
| 6,636,139 B2* | 10/2003 | Tsai et al. | | 336/200 |
| 6,903,644 B2* | 6/2005 | Wang et al. | | 336/200 |
| 7,459,761 B2* | 12/2008 | Lin | | 257/528 |
| 2007/0126543 A1* | 6/2007 | Yeh et al. | | 336/200 |

OTHER PUBLICATIONS

Treleaven et al , "Integrated Circuit Passive Components." Whitepapers, Chipworks, http://www.chipworks.com.tw/resources/whitepapers/ IC Passives.pdf, 4 pages, date unknown, last viewed Jan. 31, 2007.

* cited by examiner

*Primary Examiner* — Tuyen Nguyen
(74) *Attorney, Agent, or Firm* — Sterne, Kessler, Goldstein & Fox PLLC

(57) ABSTRACT

A system and method utilize a redistribution layer in a flip-chip or wirebond package, which is also used to route signals to bumps, as a layer for the construction of an on-chip inductor or a layer of a multiple-layer on-chip inductor. In one example, the redistribution layer is surrounded by dual-layer passivation to protect it, and the inductor formed thereby, from the environment and isolate it, and the inductor formed thereby, from the metal layer beneath it.

20 Claims, 13 Drawing Sheets

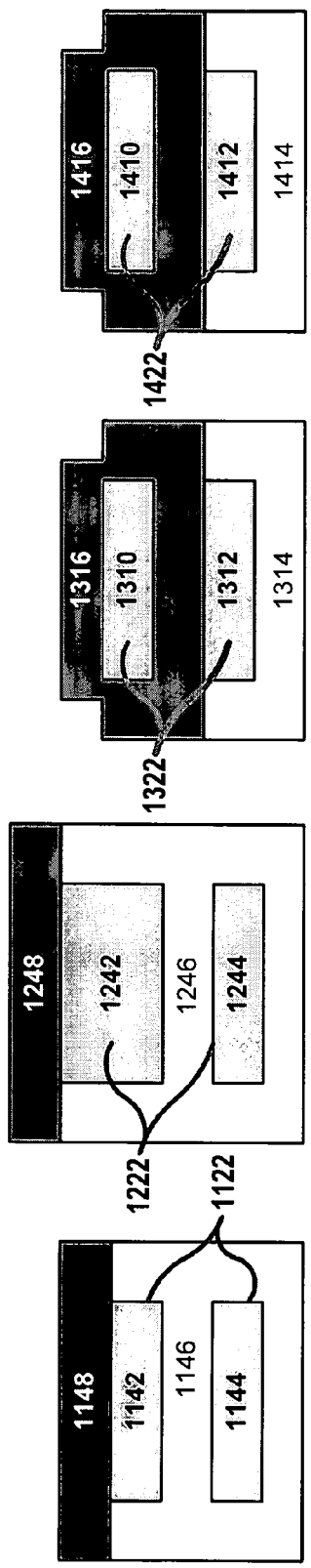

ON-CHIP INDUCTOR USING REDISTRIBUTION LAYER AND DUAL-LAYER PASSIVATION

BACKGROUND

1. Field

The present invention is related to on-chip passive devices, such as on-chip inductors.

2. Related Art

Demand for reduced size, high performance, lower power, and lower cost semiconductor products are factors that have driven the industry trend to move many off-chip passive devices to now be integrated on-chip. An example passive device is an inductor. The inductor is a key passive element in circuit applications, such as voltage controlled oscillators, low noise amplifiers, mixers and power amplifiers.

For an inductor, impedance goes up with frequency. It behaves as a short circuit at low frequencies and as an open circuit at high frequencies. An important benchmark of a good inductor is the quality factor (Q), which is equal to the ratio of a center frequency to a bandwidth of the inductor. It is a measure of the "quality" of a resonant system. Systems with a high Q factor resonate with a greater amplitude (at the resonant frequency) than systems with a low Q factor.

On-chip inductors are usually implemented by spiral structures fabricated on metal layers. The inductors can have different shapes, such as square, circular, or octagonal, they can be symmetric or non-symmetric, and/or they can be implemented with a single metal layer or multiple metal layers. To form these on-chip inductors, existing metal interconnect layers are used in a concentric ring-type structure to maximize inductance. The metal layers are also used for signal routing or power bussing.

The Q factor for an inductor increases the further it is placed from a substrate on which the chip is formed. A key factor that limits the construction of inductors using a top metal layer of the chip is the necessity to insulate the top metal layer of the chip from the outside environment (i.e., moisture, salt, scratch, etc) through films such as silicon nitride. To meet performance targets for the inductor, it may be necessary to add more mask layers to add additional layers of metal to increase the Q factor. However, the additional metal layers will substantially add cost to the final product (e.g., 6-7% of the overall "cost" of the product per additional metal layer).

Therefore, what is needed is a system and method that enhance inductor Q factor within existing processing steps of a chip, without adding "cost" to the overall chip.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 4:
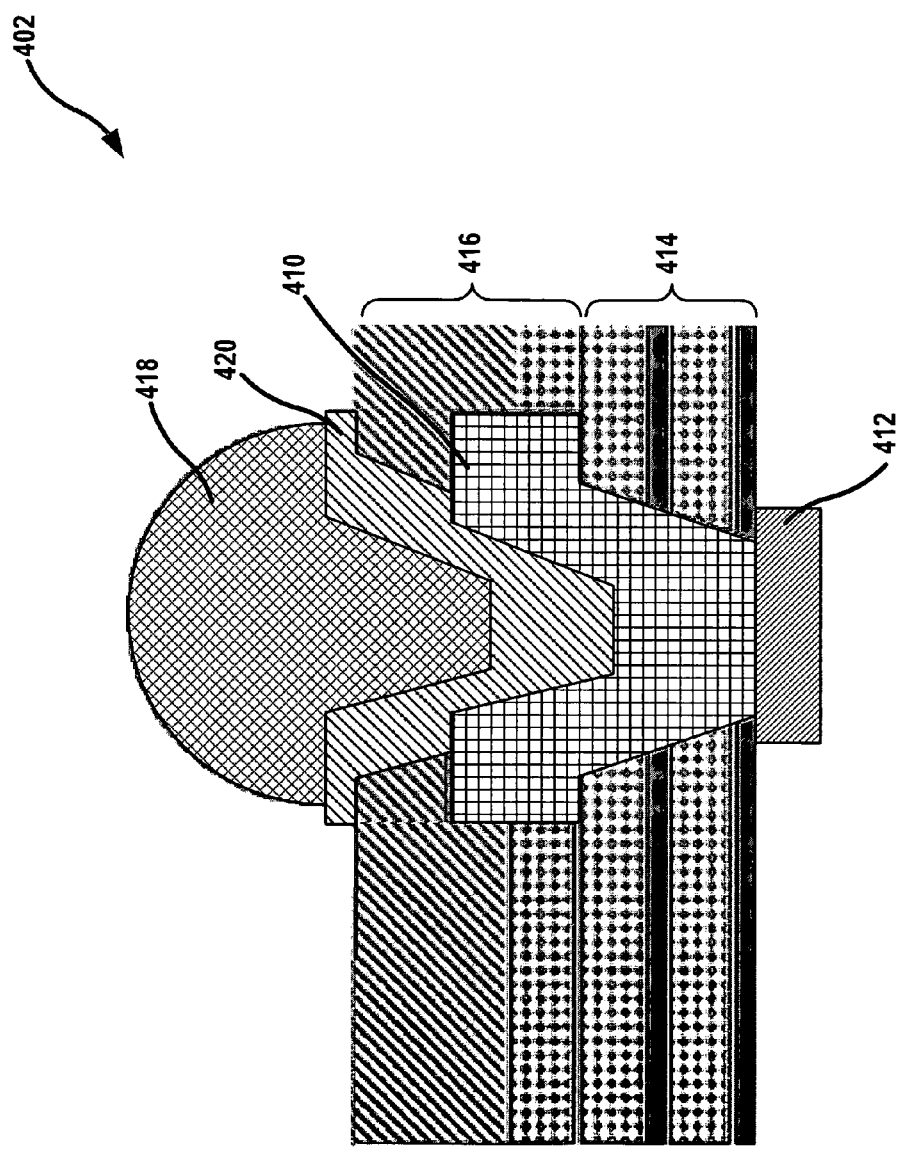
Figure 5:
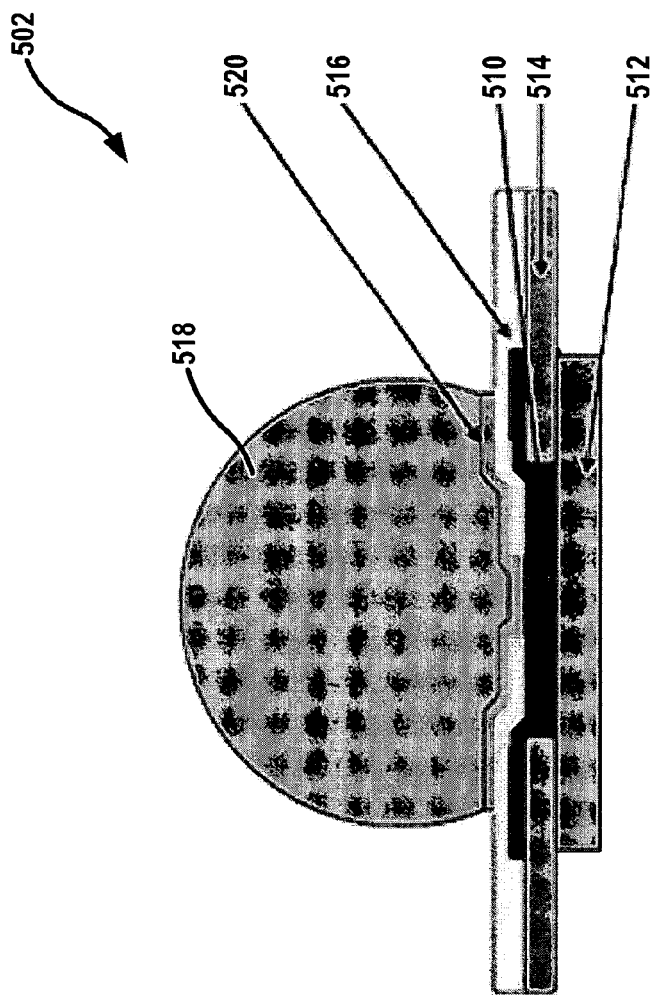
Figure 6:
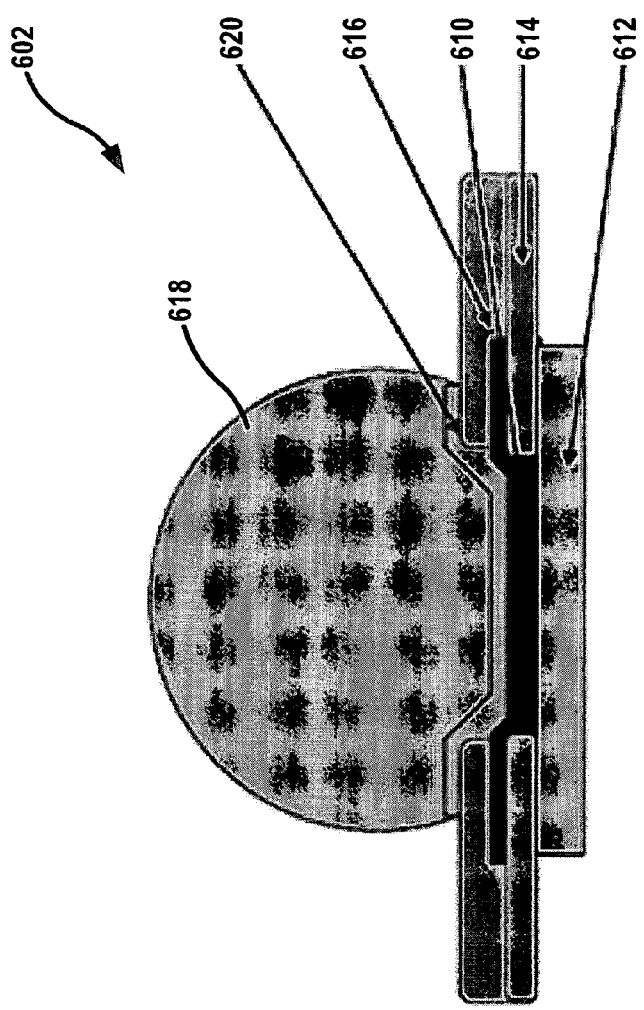

FIGS. 4, 5, and 6 show cross-sectional views of a bump structure, according to various embodiments of the present invention.

Figure 7:
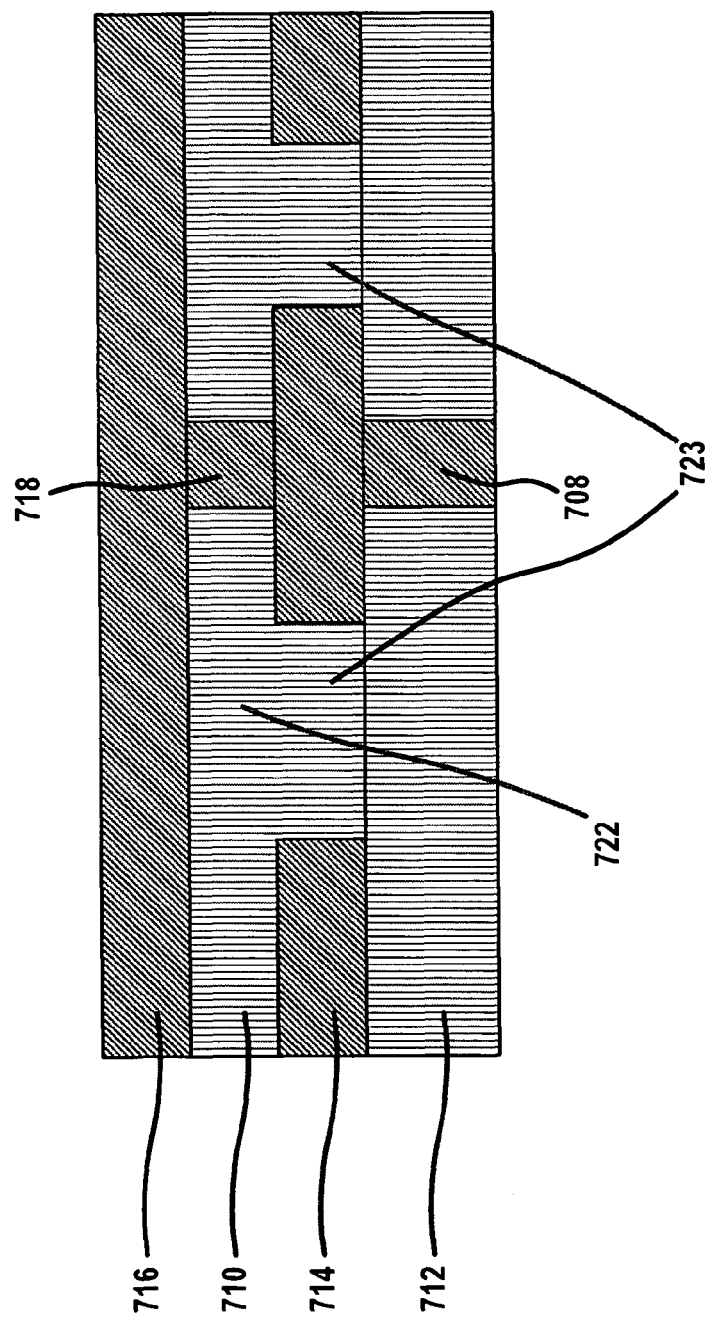
Figure 8:
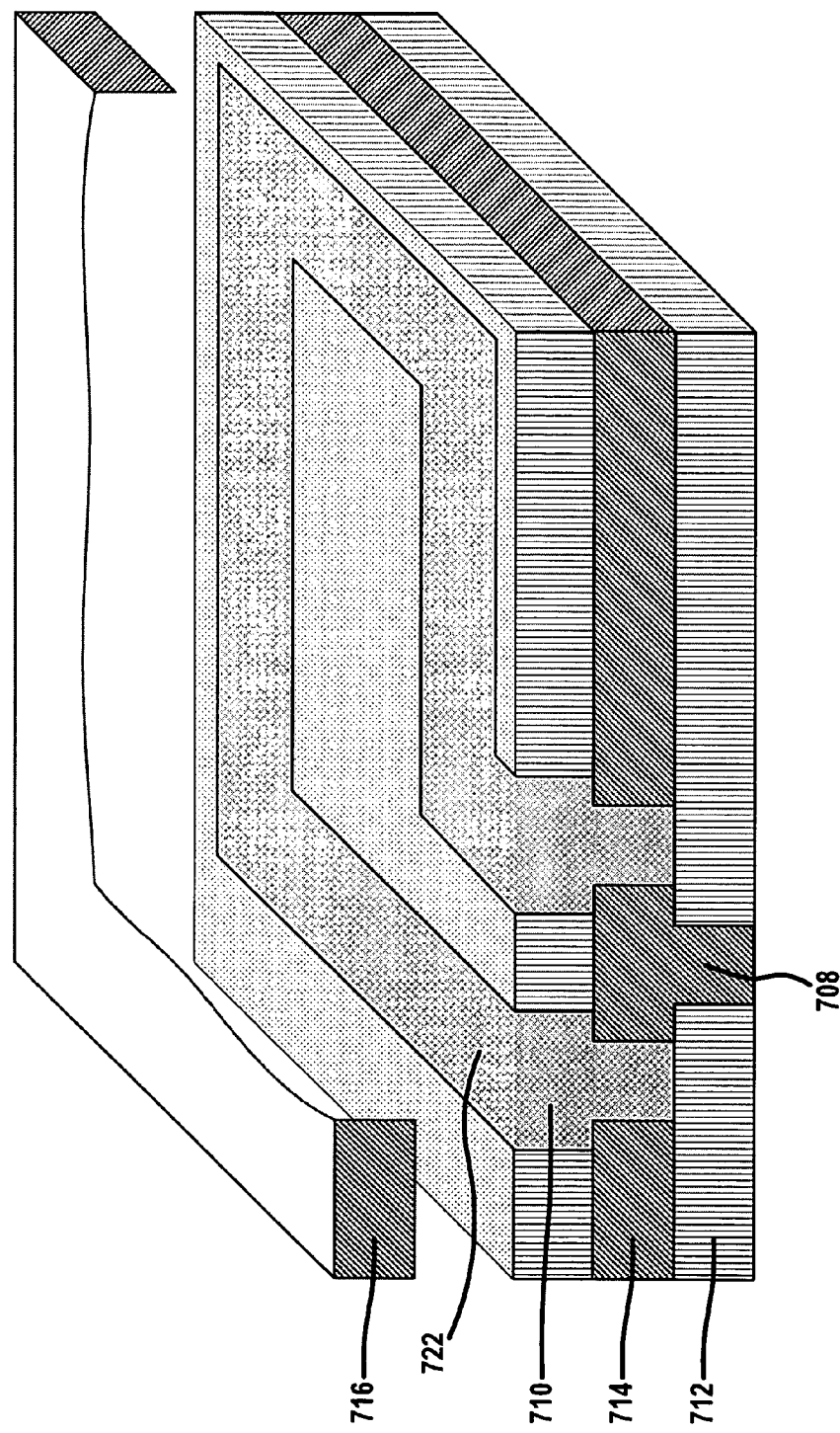

FIGS. 7 and 8 show cross-sectional side and cut-away perspective views of an inductor formed in a redistribution layer of a flip-chip, according to one embodiment of the present invention.

Figure 9:
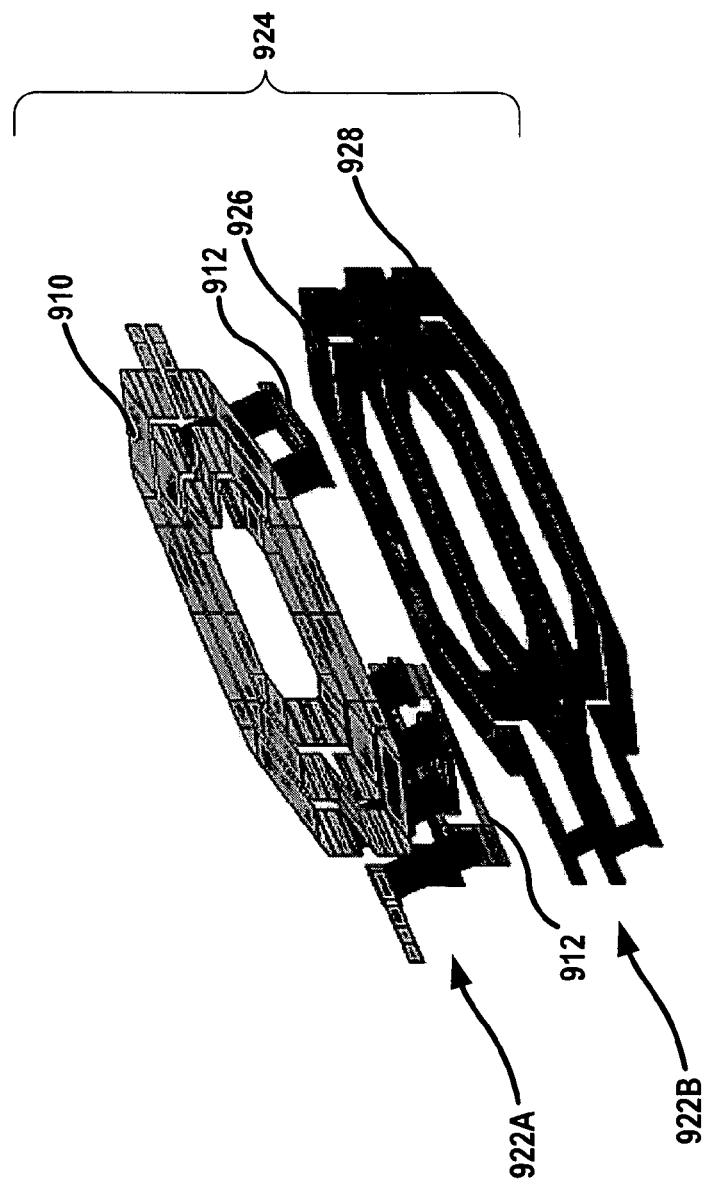

FIG. 9 shows a transformer partially formed in a redistribution layer of a flip-chip, according to one embodiment of the present invention.

Figure 10:
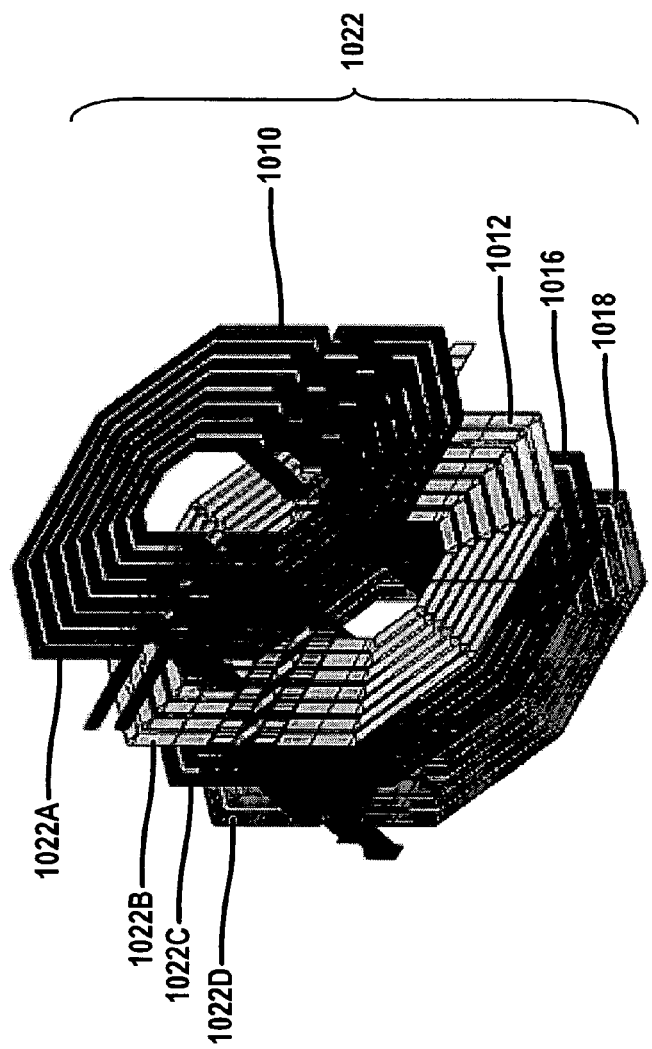

FIG. 10 shows a high Q spiral inductor, according to one embodiment of the present invention.

FIGS. 11, 12, 13, and 14 show various arrangements of two layer inductors, according to various embodiments of the present invention.

Figure 15:
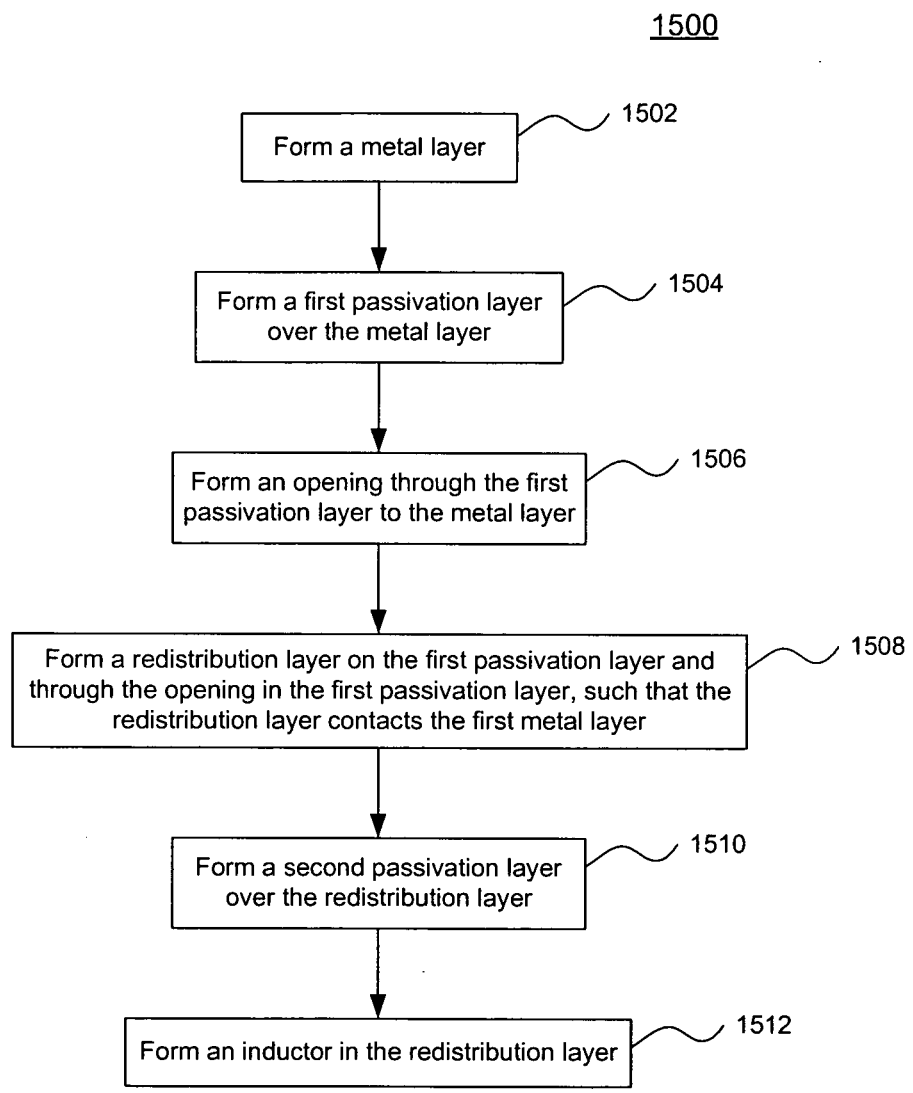

FIG. 15 shows a flowchart depicting a method for forming an on-chip inductor, according to one embodiment of the present invention.

Figure 16:
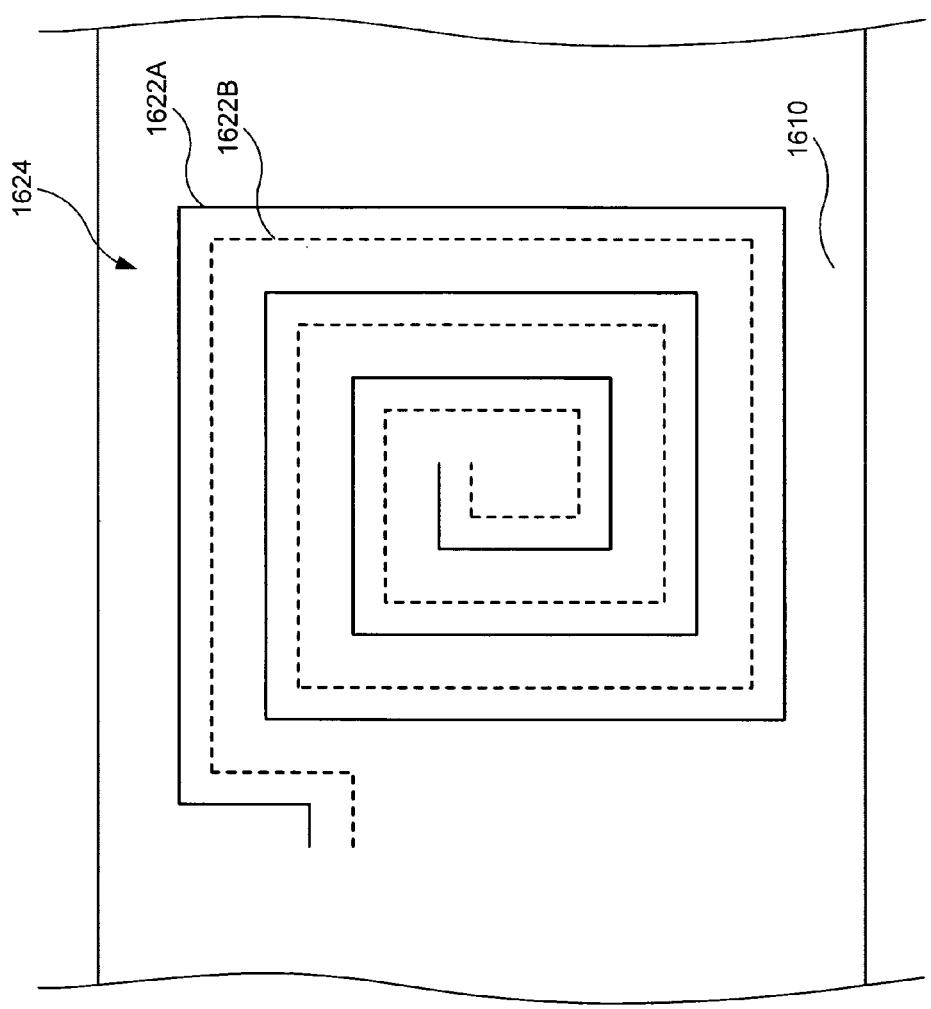

FIG. 16 shows a transformer, according to one embodiment of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION

Overview

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

One embodiment of the present invention provides a system and method that utilize a redistribution layer in a flip-chip or wirebond package, which is also used to route signals to bumps, as a layer for the construction of an on-chip inductor or a layer of a multiple-layer on-chip inductor. In one example, the redistribution layer is surrounded by dual-layer passivation to protect it, and the inductor formed thereby, from the environment and isolate it, and the inductor formed thereby, from the metal layer beneath it. Through use of the redistribution layer and dual-layer passivation of the flip-chip or the wirebond, no additional "costs" are added to the manufacturing process in order to form an on-chip inductor at an optimum location, such that it has an optimum Q factor.

Exemplary Overall Systems

Figure 1:
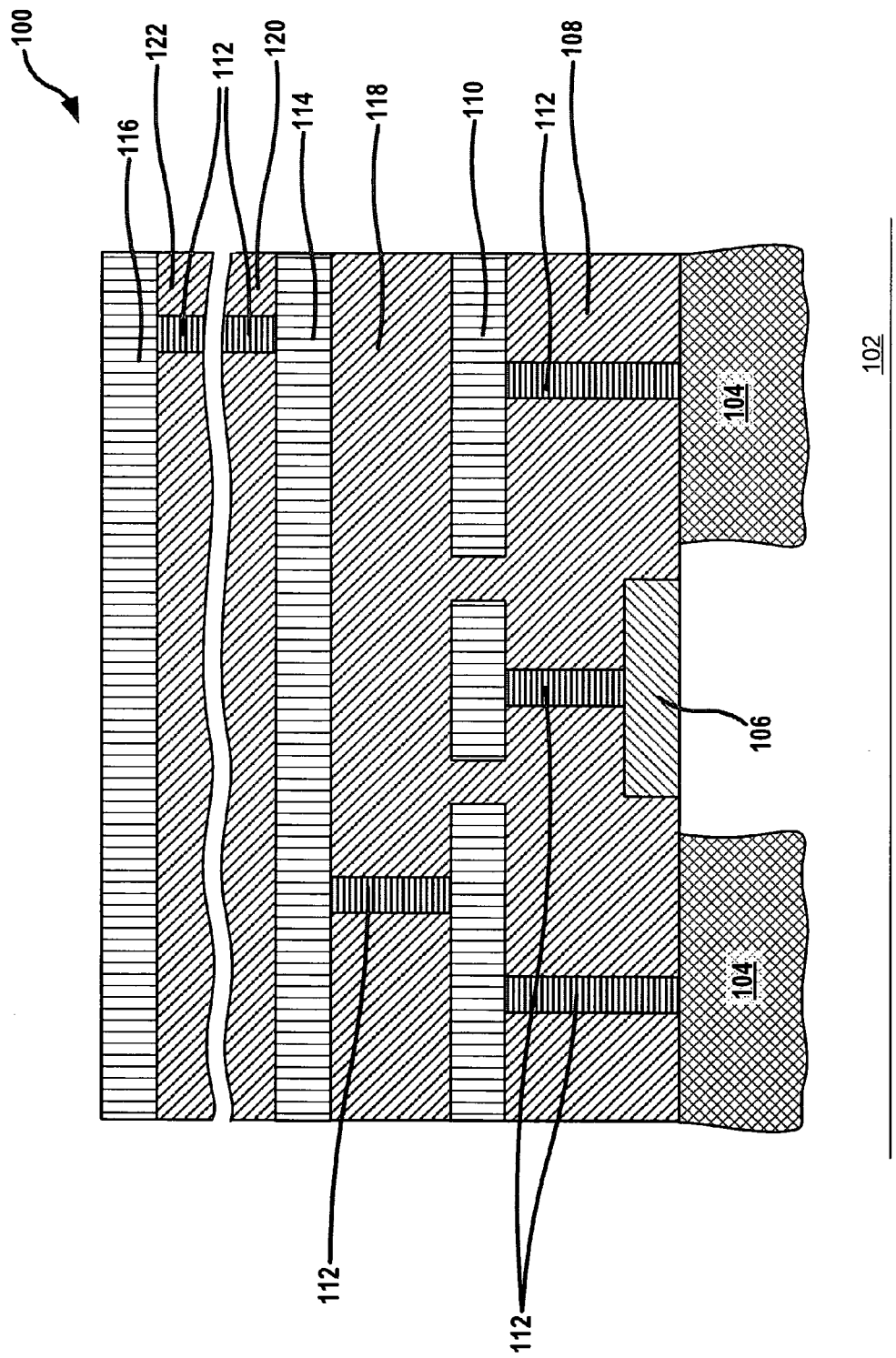
FIG. 1 shows a cross-section of a portion of a chip.

FIG. 1 shows a cross-section of a portion 100 of a chip. Portion 100 includes a substrate 102 having diffusion regions 104. A polysilicon 106 is formed on the substrate 102 between the diffusion regions 104. A first dielectric layer 108 (e.g., a passivation layer) is formed between substrate 102 and a first metal layer 110. Connections 112 are formed between first metal layer 110 and substrate 102 through an opening (e.g., a channel or via) in first dielectric layer 108. Similarly, additional metal layers 114 and 116 and alternating additional dielectric layers 118, 120, and 122 (only a few of each are shown for convenience) are formed, along with connections 112 between the metal layers and through openings in respective ones of the dielectric layers.

In one example, when bond wire packaging is used, an inductor (not shown) or a layer of an inductor (not shown) can be formed in one of the metal layers. As briefly discussed above, inductors experience reduced Q factor and increase resistance the closer they are located to substrate 102, for example due to eddy currents. Thus, it has been determined the highest metal layer of a chip, e.g., metal layer 116, is the most desirable layer on which to form an inductor.

Figure 2:
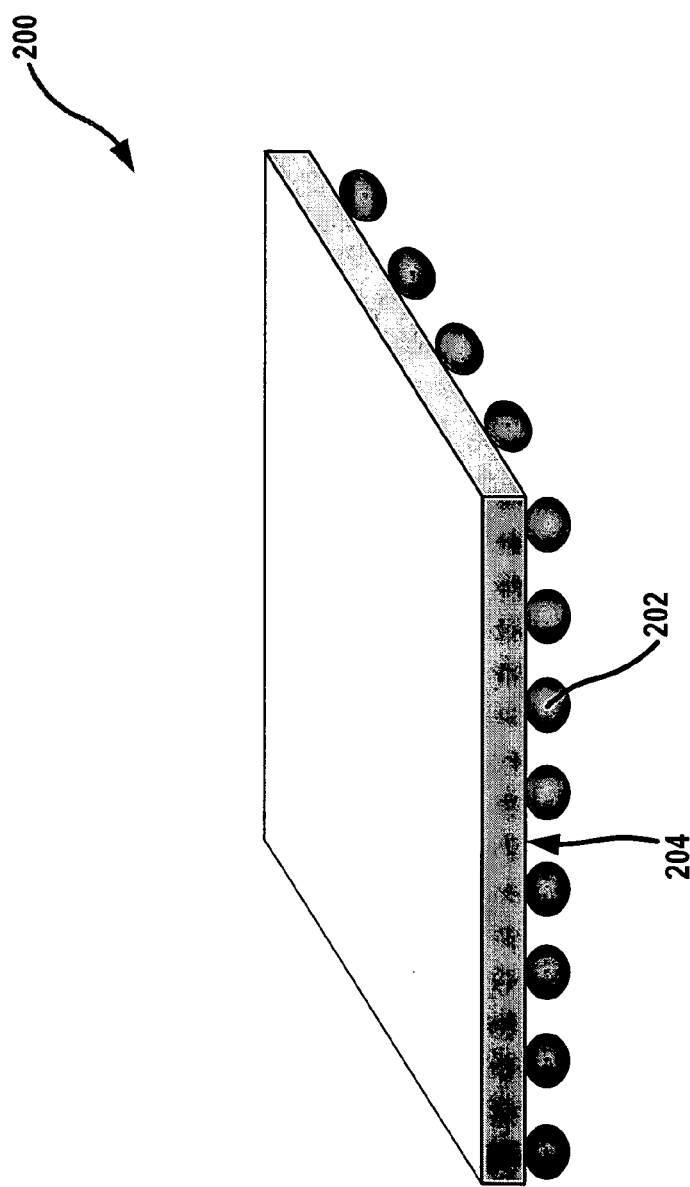
FIGS. 2 and 3 show perspective and bottom views of a bump or flip chip packaging arrangement, according to one embodiment of the present invention.
Figure 3:
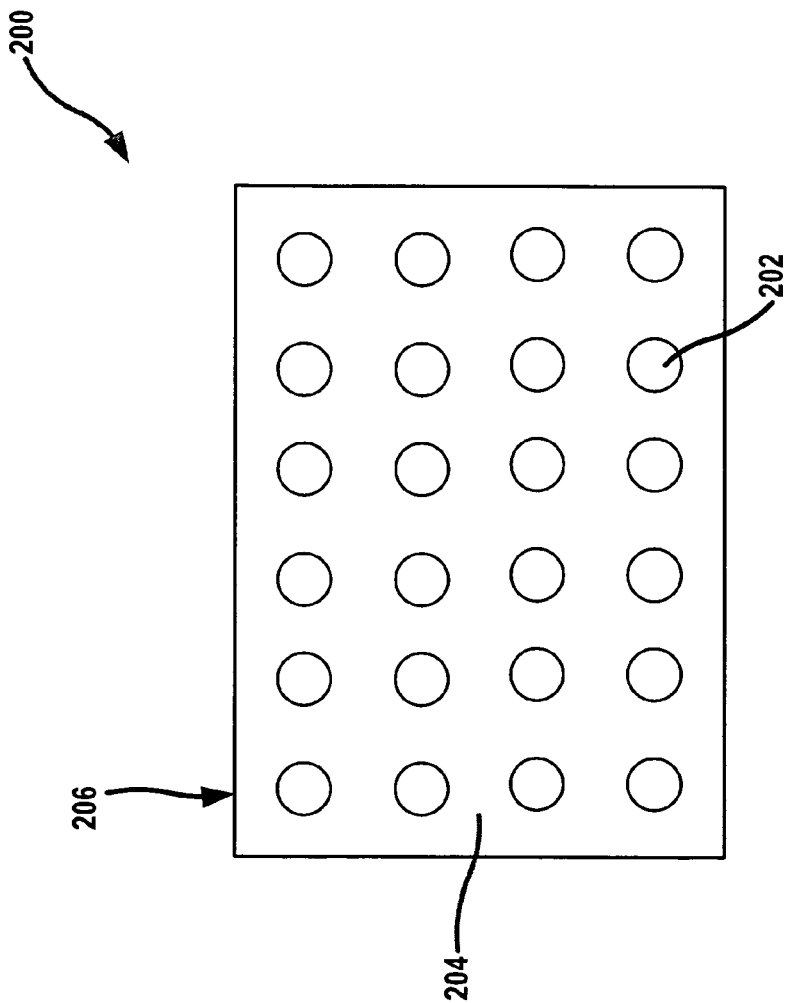

FIGS. 2 and 3 show perspective and bottom views of a bump or flip chip packaging arrangement 200, according to one embodiment of the present invention. Flip chip package 200 includes an array of bumps 202 in a surface 204. Flip-chips are considered very high performance devices. A flip chip is a leadless, monolithic structure that contains an integrated circuit designed to electrically and mechanically interconnect to a circuit. Connection is made to bump contacts 202, which may be covered with a conductive bonding agent (not shown), on the face 204 of the circuit.

In one example, packaging 200 is considered a ball grid array (BGA) version of a flip chip package. In a BGA-Flip Chip an integrated circuit surface 204 has an area array of solder balls 202 that are attached to the bottom side of a substrate 206 that also includes signal and power routing layers.

FIGS. 4, 5, and 6 show cross-sectional views of bump structures 402, 502, and 602, respectively, of a flip-chip, according to various embodiments of the present invention.

With reference to FIG. 4, bump structure 402 includes a metal redistribution layer 410 (e.g., made from aluminum or copper) (hereinafter, the terms redistribution layer and metal redistribution layer will be used interchangeably) coupled to a top metal layer 412 of a chip. The redistribution and top metal layers 410 and 412 are encapsulated in first and second layers of passivation 414 and 416. In one example, each passivation layer 414 and 416 is formed through one or more layers of similar or different dielectrics, discussed in more detail below. A solder ball 418 is formed on an under bump metal layer 420, which under bump metal layer 420 is formed on metal distribution layer 410.

In one example, redistribution layer 410 is a thin film routing layer formed primarily from, for example, aluminum or copper. Redistribution layer 410 can be used to route signals and provide for distributed power and ground. In one example, redistribution layer 410 can vary in thickness from about 1 to 3 microns and have a width of from about 12-100 microns, depending on the specific design requirements.

With reference to FIGS. 5 and 6, alternative passivation layer schemes for bump structures 502 and 602, which are similar to structure 402, are shown.

FIG. 5 shows a redistribution layer 510 formed on a top metal layer 512 through an opening in a first passivation layer 514. A second passivation layer 516 is formed over first passivation layer 514 and redistribution layer 510. A bump metal layer 520 is formed to connect a bump 518 and redistribution layer 510. The connection is made through forming of bump metal layer 520 on top of and through an opening in second passivation layer 516. In this example, first passivation layer 514 is formed with nitride and second passivation layer 516 is formed with polyimide.

FIG. 6 shows a redistribution layer 610 formed on a top metal layer 612 through an opening in a first passivation layer 614. A second passivation layer 616 is formed over first passivation layer 614 and redistribution layer 610. A bump metal layer 620 is formed to connect a bump 618 and redistribution layer 610. The connection is made through forming of bump metal layer 620 on top of and through an opening in second passivation layer 616. In this example, first and second passivation layers 614 and 616 are both formed with nitride.

FIGS. 7 and 8 show cross-sectional side and cut-away perspective views of an inductor 722 formed in a redistribution layer 710, according to one embodiment of the present invention.

According to this embodiment of the present invention, a metal redistribution layer 710, which is already present in flip-chip packaging for routing of signals and power, is also used to form an on-chip inductor 722. This can be done because metal distribution layer 710 is encapsulated within two layers of passivation 714 and 716 to isolate it from metal routing layers below (not shown) and the environment from above.

FIGS. 7 and 8 essentially show the bump structure from either FIG. 4, 5, or 6, but without the under bump metal layer 420/520/620 and the solder ball 418/518/618. In this example, inductor 722 is a single loop inductor formed on redistribution layer 710. It is to be appreciated that inductors having multiple loops and/or formed on multiple layers are also contemplated within the scope of the present invention, as discussed below. As shown, two nodes or ends 723 of inductor 722 extend through dielectric layer 714 to contact top metal layer 712. Openings formed in each of redistribution layer 710 and contact top metal layer 712 include dielectric material 708 and 718, respectively. Dielectric material 708 and 718 can, in one example, be similar to the material used to form first and second passivation layers 714 and 716.

In various examples, passivation layers 714 and 716, and dielectric portions 708 and 718, can be made from either a single material or a combination of materials, for example oxide, nitride, oxynitride, polyimide, etc.

In one example, performance of inductor 722 using this metal redistribution layer 710 is comparable to or better than using an additional top metal routing layer of FIG. 1, without the additional chip "cost." This is because real estate and processing steps of the chip can be reduced through the use of already existing redistribution layer 710 and dual passivation layers 714 and 716. It is to be appreciated that because redistribution layer 710 is always the farthest metal layer from a substrate (not shown), on which the chip is formed, redistribution layer 710 provides the best Q factor of any location on the chip for the on-chip inductor 722.

In one example, a thickness of redistribution metal layer 710 can be increased to, in turn, increase the Q factor of the resulting inductor 722. For example, this is because $Q=\omega L/R$, where L is inductance, R is resistance, and $\omega$ is the angular velocity in radians per second. Thus, Q is proportional to 1/R so as resistance goes down, Q increases. When a thickness of redistribution metal layer 710 increases, resistance goes down based on there being more cross section area to carry a current. This allows for the proportional increase in Q.

FIG. 9 shows a transformer 924 partially formed in a redistribution layer 910, according to one embodiment of the present invention. For example, transformer 924 can be designed with about a 27 μm-wide metal trace. Transformer 924 is formed from two inductors 922A and 922B. Inductor 922A is formed in a metal redistribution layer 910 and a top metal layer 912 and inductor 922B is formed in second and third metal layers 926 and 928, respectively. In this arrangement, second and third metal layers 926 and 928 are closer to a substrate (not shown) than layers 910 and 912, similar to the configuration shown in FIG. 1.

FIG. 16 shows a transformer 1624, according to one embodiment of the present invention. Transformer 1624 is formed from two inductors 1622A and 1622B. Both inductors 1622A and 1622B are formed on a same metal layer, for example in a metal redistribution layer 1610. It is to be appreciated, another metal layer could also be used as the single metal layer in which transformer 1624 is formed.

FIG. 10 shows a high Q spiral inductor 1022, according to one embodiment of the present invention. Inductor 1022 is constructed from multiple inductor layers 1022A-1022D, each layer being constructed in a respective redistribution or metal layer 1010, 1012, 1026, and 1028. For example, a value of the inductance of inductor 1022 is determined based on calculating a series inductance comprised of inductors 1022A-1022D. Similar to the embodiments shown in FIGS. 7, 8, and 9, in this embodiment layer 1010 is a metal redistribution layer of a flip-chip arrangement.

FIGS. 11, 12, 13, and 14 show various arrangements of two layer inductors 1122, 1222, 1322, and 1422 that exhibit similar inductor characteristics, however with different manufacturing costs, according to various embodiments of the present invention. As a general comparison, FIG. 11 is similar to FIG. 1, FIG. 12 is similar to FIGS. 1 and 11 with an extra thick metal layer, and FIGS. 13 and 14 are similar to FIGS. 7 and 8.

FIG. 11 shows an inductor 1122 comprised of a first metal layer 1142 and a second metal layer 1144 that are separated by a first dielectric layer 1146. A second dielectric layer 1148 is formed over first metal layer 1142 and first dielectric layer 1146. The thickness of metal layer 1142 is, for example, about 9000 Å and exhibits a conductivity of about $5 \times 10^7$ (s/m).

FIG. 12 shows an inductor 1222 comprised of a first metal layer 1242 (e.g., an extra thick metal layer) and a second metal layer 1244 that are separated by a first dielectric layer 1246. A second dielectric layer 1248 is formed over first metal layer 1242 and first dielectric layer 1246. The thickness of metal layer 1242 is, for example, about 33000 Å and exhibits a conductivity of about $5.88 \times 10^7$ (s/m).

FIG. 13 shows an inductor 1322 comprised of a first metal layer 1310 (e.g., a metal redistribution layer) and a second metal layer 1312. First metal layer 1310 is surrounded by a passivation layer 1316 and second metal layer 1312 is surrounded by a passivation layer 1314. In this embodiment, first metal layer 1310 is formed of aluminum. The thickness of aluminum layer 1310 is, for example, 14000 Å and exhibits a conductivity of about $3.28 \times 10^7$ (s/m).

FIG. 14 shows an inductor 1422 comprised of a first metal layer 1410 (e.g., a metal redistribution layer) and a second metal layer 1412. First metal layer 1410 is surrounded by a passivation layer 1416 and second metal layer 1412 is surrounded by a passivation layer 1414. In this embodiment, first metal layer 1410 is formed of copper. The thickness of copper layer 1410 is, for example, 9000 Å and exhibits a conductivity of about $5.05 \times 10^7$ (s/m).

Exemplary Process to Form an On-Chip Inductor

FIG. 15 shows a flowchart depicting a method 1500 to form a on-chip inductor, according to one embodiment of the present invention. The standard pre and post processing steps occurring during normal semiconductor manufacture have been left out for convenience. However, a skilled artisan will understand when these steps can take place based on reading and understanding the description.

In step 1502, a metal layer is formed. In one example, this can be a top metal layer of a chip already having several metal and dielectric layers formed on a substrate. In step 1504, a first passivation layer is formed over the metal layer. In various examples, different materials can be used for the passivation layer, for example oxide, nitride, oxynitride, polyimide, etc. In step 1506, an opening (or via) is formed through the first passivation layer to the metal layer. In one example, multiple openings can be formed for multiple connections between metal layers and/or for multiple nodes of an inductor (discussed below, and see, e.g., FIGS. 7 and 8). In step 1508, a redistribution layer is formed on the first passivation layer and through the opening in the first passivation layer, such that the redistribution layer contacts the first metal layer. The redistribution layer will have a generally stepped shape. In various examples, the redistribution layer can be any substantially conductive material, such as aluminum or copper, although the use of aluminum is desired. In step 1510, a second passivation layer is formed over the redistribution layer. In step 1512, the inductor is formed in the redistribution layer. A node or end of the inductor is the portion of the redistribution layer formed through the opening in the first passivation layer, as discussed above. If the inductor has two nodes or ends, they would correspond to additional portions of the redistribution layer that is formed through additional openings in the first passivation layer.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor(s), and thus, are not intended to limit the present invention and the appended claims in any way.

What is claimed is:

1. An apparatus, comprising:
   a metal layer;
   a first passivation layer formed on the metal layer, the first passivation layer having a channel therethrough running to the metal layer;
   a redistribution layer formed on the first passivation layer and formed in the channel, such that the redistribution layer contacts the metal layer and is configured to route signals;
   a second passivation layer formed on the first passivation layer and the redistribution layer; and
   a passive electrical element at least partially formed in the redistribution layer;
   wherein a thickness of the redistribution layer is based on a desired Q factor; and
   wherein the redistribution layer is the furthest metal layer from a substrate layer.

2. The apparatus of claim 1, wherein the passive electrical element comprises a multiple-layer passive electrical element, wherein:
   a first layer is formed in the redistribution layer; and
   a second layer is formed in the metal layer.

3. The apparatus of claim 1, further comprising:
a second metal layer;
a dielectric layer formed between the first metal layer and the second metal layer, the dielectric layer having a channel therethrough; and
a connection device formed between the first metal layer and the second metal layer and through the channel in the dielectric layer.

4. The apparatus of claim 3, wherein the passive electrical element comprises a multiple-layer passive electrical element, wherein:
a first layer is formed in the redistribution layer;
a second layer is formed in the first metal layer; and
a third layer is formed in the second metal layer.

5. The apparatus of claim 1, wherein the passive electrical element comprises a transformer comprising first and second inductors, wherein the first and second inductors are formed in the redistribution layer.

6. The apparatus of claim 1, wherein the passive electrical element comprises a transformer comprising first and second inductors, wherein:
the first inductor is formed in the redistribution layer; and
the second inductor is formed in the metal layer.

7. The apparatus of claim 1, wherein the first and second passivation layers comprise a same material.

8. The apparatus of claim 1, wherein the first and second passivation layers comprise different materials.

9. The apparatus of claim 1, wherein the redistribution layer comprises a low resistivity metal.

10. The apparatus of claim 1, wherein the redistribution layer comprises aluminum or copper.

11. The apparatus of claim 1, wherein the passive electrical element comprises an inductor.

12. The apparatus of claim 1, wherein the first and second passivation layers comprise nitride.

13. The apparatus of claim 1, wherein one of the first and second passivation layers comprises nitride and another one of the first and second passivation layers comprises polyimide.

14. The apparatus of claim 1, wherein the redistribution layer is encapsulated between the first and second passivation layers.

15. The apparatus of claim 1, further comprising:
a plurality of additional metal layers;
a plurality of corresponding dielectric layers formed between the plurality of additional metal layers and between a top-most one of the plurality of the additional metal layers and the first metal layer;
a substrate located below a bottom-most one of the plurality of dielectric layers; and
a plurality of connecting devices connecting respective ones of the plurality of the additional metal layers, the substrate, and the first metal layer, the plurality of the connecting devices passing through vias in respective ones of the plurality of corresponding dielectric layers.

16. The apparatus of claim 1, wherein:
the first passivation layer comprises oxide, nitride, oxynitride, or polyimide; and
the second passivation layer comprises oxide, nitride, oxynitride, or polyimide.

17. The apparatus of claim 1, wherein the apparatus is located within a flip-chip package.

18. The apparatus of claim 1, wherein the apparatus is located within a wirebond package.

19. The apparatus of claim 1, wherein the redistribution layer is configured to route signals to bumps in a flip-chip package.

20. The apparatus of claim 1, wherein the redistribution layer is configured to distribute power and ground.

* * * * *